(12) United States Patent
Motoda

(10) Patent No.: US 8,063,594 B2
(45) Date of Patent: Nov. 22, 2011

(54) MOTOR DRIVE APPARATUS

(75) Inventor: Haruaki Motoda, Isesaki (JP)

(73) Assignee: Hitachi, Ltd., Tokyo (JP)

( * ) Notice: Subject to any disclaimer, the term of this patent is extended or adjusted under 35 U.S.C. 154(b) by 354 days.

(21) Appl. No.: 12/404,422

(22) Filed: Mar. 16, 2009

(65) Prior Publication Data

US 2009/0237905 A1   Sep. 24, 2009

(30) Foreign Application Priority Data

Mar. 19, 2008 (JP) ................................. 2008-072142

(51) Int. Cl.
*H02P 6/00* (2006.01)

(52) U.S. Cl. .................... 318/400.01; 361/792

(58) Field of Classification Search .................. 361/792, 361/790, 611, 624, 631, 637, 648, 98, 91.5, 361/101, 784; 318/400.01
See application file for complete search history.

(56) References Cited

U.S. PATENT DOCUMENTS

| | | | | |
|---|---|---|---|---|
| 5,365,424 A * | 11/1994 | Deam et al. | ................... | 363/144 |
| 5,629,831 A * | 5/1997 | Eggert et al. | ................... | 361/624 |
| 6,693,370 B2 * | 2/2004 | Yamane et al. | ............. | 307/10.1 |
| 6,724,627 B2 * | 4/2004 | Onizuka et al. | ............... | 361/704 |
| 7,899,602 B2 * | 3/2011 | Yoshinari et al. | ............. | 701/104 |
| 2003/0200761 A1 | 10/2003 | Funahashi et al. | | |
| 2003/0206392 A1 | 11/2003 | Kawata | | |
| 2005/0094356 A1 * | 5/2005 | Onizuka et al. | ............... | 361/611 |
| 2006/0152095 A1 * | 7/2006 | Kikuchi et al. | ............. | 310/68 R |
| 2007/0045037 A1 | 3/2007 | Yoshinari et al. | | |
| 2008/0112201 A1 * | 5/2008 | Yahata et al. | .................. | 363/131 |
| 2008/0198548 A1 * | 8/2008 | Nakamura et al. | ............. | 361/689 |
| 2010/0089607 A1 * | 4/2010 | Nakamura et al. | ........... | 174/68.2 |
| 2010/0231038 A1 * | 9/2010 | Sugimura et al. | .............. | 307/9.1 |

FOREIGN PATENT DOCUMENTS

| | | |
|---|---|---|
| EP | 1 363 026 | 11/2003 |
| JP | 2002-325467 | 11/2002 |
| JP | 2003-011829 | 1/2003 |
| JP | 2003-309384 | 10/2003 |
| JP | 2005-036773 | 2/2005 |
| JP | 2007-030652 | 2/2007 |

* cited by examiner

*Primary Examiner* — Lisa Lea Edmonds
*Assistant Examiner* — Xanthia C Cunningham
(74) *Attorney, Agent, or Firm* — Antonelli, Terry, Stout & Kraus, LLP.

(57) ABSTRACT

A motor drive apparatus includes an assembly of first and second subassemblies. The first subassembly includes a first board and at least one connecting member, such as a bus bar, formed in the first board, and arranged to form a current supply path from a power source to the motor. The second subassembly includes a second board and at least one switching device mounted on the second board. The first and second subassemblies are stacked with an interspace between the first and second boards. A terminal segment of the switching device is connected with a terminal segment of the connecting member.

20 Claims, 13 Drawing Sheets

MOTOR DRIVE APPARATUS

BACKGROUND OF THE INVENTION

The present invention relates to an assembly of components forming a circuit such as a motor drive circuit, and more specifically to a motor (drive) unit or motor control unit.

A published Japanese patent application Pub. No. 2003-309384 (corresponding to US 2003/206392 A1) shows an electric power steering system including a motor for producing a steering assist torque for a vehicle, a drive circuit for driving the motor and a control circuit for controlling the drive circuit. In this system, a plurality of switching devices are mounted on an inclined surface of a housing and fixed one by one by screw fasteners.

SUMMARY OF THE INVENTION

In the system of the above-mentioned patent document, the assembly process is problematical because of the operation of fastening each switching device.

It is therefore an object of the present invention to provide an apparatus or assembly having a structure facilitating the assembly process.

According to one aspect of the invention, an apparatus, such as a motor drive apparatus or assembly, comprises at least first and second subassemblies. The first subassembly includes a first board and a connecting section formed in the first board, so as to form a current supply path from a power source to the motor. The second subassembly includes a second board and a switching section mounted on the second board. A terminal segment of the switching section is connected with a terminal segment of the connecting member.

DETAILED DESCRIPTION OF THE INVENTION

Figure 1:
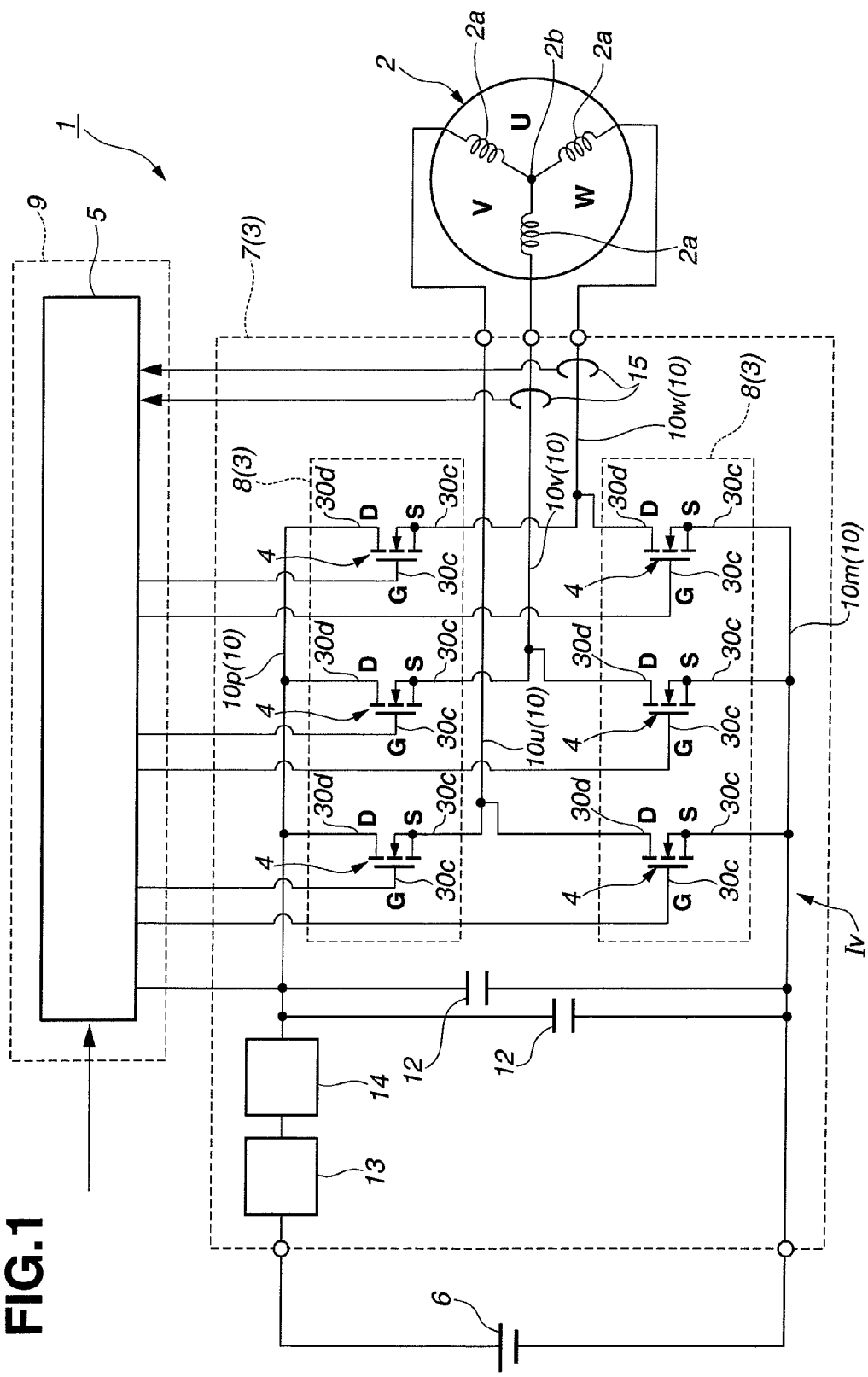
FIG. 1 is a view schematically showing the circuit configuration of a motor (drive) unit according to one embodiment of the present invention.

FIG. 1 shows a motor unit (or motor drive unit) according to an embodiment of the present invention. In an example shown in FIG. 1, a motor for an electric power steering system and a control unit for controlling the motor are assembled into a motor (drive) unit 1. FIG. 1 schematically shows the circuit configuration of motor unit 1. The following is explanation on the construction of motor unit 1 of this example. A motor drive apparatus can be considered to be an assembly including at least part of motor unit 1.

A motor 2 is a three-phase inverter motor having U, V and W phases. Motor unit 1 includes motor 2, a (motor) drive circuit 3 for producing drive current for driving the motor 2, and a (motor) control circuit 5 for producing a control signal for controlling at least one switching device 4 included in drive circuit 3.

Drive circuit 3 includes a switching section including one or more switching devices 4. According to the illustrated embodiment, drive circuit 3 includes a plurality of switching devices 4 arranged to form an inverter Iv. In the example of FIG. 1, there are six of the switching devices 4 and all the switching devices 4 are FETs (field effect transistors). Inverter Iv changes direct-current power supplied from a direct-current power source (such as battery) 6, to alternating-current power, by performing PWM control, for example, and supplies an alternating-current to each of coils 2a of the three phases of motor 2. In this embodiment, the drive circuit 3 is formed by a plurality of subassemblies. In the example shown in FIG. 1, motor unit 1 includes three different subassemblies 7, 8 and 9, and the total number of the subassemblies is four.

The first (or primary) subassembly 7 includes a first board 11 and a connecting section including at least one connecting member in the form of a bus bar 10 forming a current path conducting a relatively high current supplied from the dc power source 6 to motor 2. First subassembly 7 shown in FIG. 1 includes (first and second supply side) bus bars 10p and 10m to be connected, respectively, with positive and negative terminals (or electrodes) of dc power source 6, and (first, second and third load side) bus bars 10u, 10v and 10w to be connected, respectively, with the U, V and W phases of motor 2. Each bus bar 10 includes a bar-shaped member or relatively thick strip of electrically conductive metallic material, such as material including iron, copper or alloy containing iron and/or copper, formed into an appropriate shape such as a shape having bent portion or bifurcation. Each bus bar 10 includes at least one terminal segment 30a in the form of a projecting end used for connection with another conductor.

The second subassembly 8 includes a second board 21 and at least one switching device 4. Second subassembly 8 is a subassembly separate from first subassembly 7. Motor unit 1 may include a plurality of the second subassemblies 8. In the example of FIG. 1, there are two of the second subassemblies 8 which can be referred to as positive-side second subassembly (or first switch subassembly) and a negative-side second subassembly (or second switch subassembly). Positive-side second subassembly 8 includes three of the switching devices 4 connected between the positive terminal (+) of dc power source 6 and a neutral point 2b of motor 2 in the form of three-phase inverter motor. Negative-side second subassembly 8 includes three of the switching devices 4 connected between the negative terminal (−) of dc power source 6 and the neutral point 2b of motor 2. First and second switch subassemblies 8 are identical to each other, so that first and second switch subassemblies 8 can be fabricated as common component parts.

Drive circuit 3 includes various (non-switch) circuit components other than switching devices 4. These circuit components (such as capacitor 12, relay 13 and coil 14) and other component (such as current sensors 15) are mounted in first assembly 7. Thus, the connecting members (bus bars) 10, and the non-switch circuit components of drive circuit 3 are incorporated in first (or primary or main) subassembly 7 whereas the switching devices 4 are separated from the first subassembly 7, and mounted in one or more separate second assemblies 8.

Control circuit 5 is a section for controlling motor 2. Control circuit 5 controls the switching devices 4 by performing calculation in accordance with an external signal and an internal signal (such as sensor signals from current sensors 15) and producing switch control signals, and thereby controls the rotational speed and torque of motor 2 by changing the characteristic of current supplied to motor 2. In this embodiment, control circuit 5 is formed as third subassembly 9 including a third board 16. In the illustrated example, third board 9 is in the form of a printed circuit board on which at least one CPU and other electronic components are mounted through soldering or other bonding methods.

Figure 2:
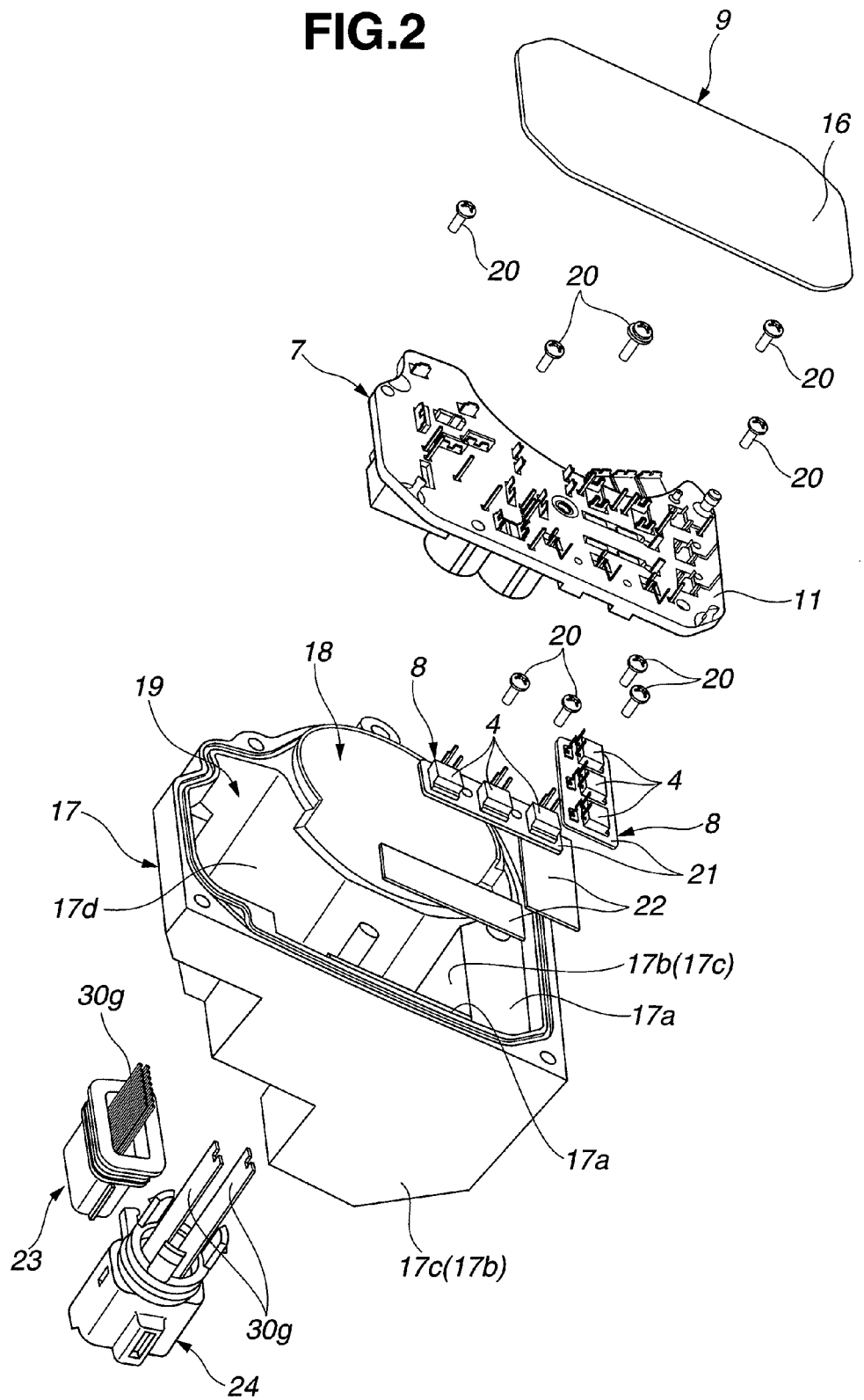
FIG. 2 is an exploded perspective view showing part of the motor unit.
Figure 3:
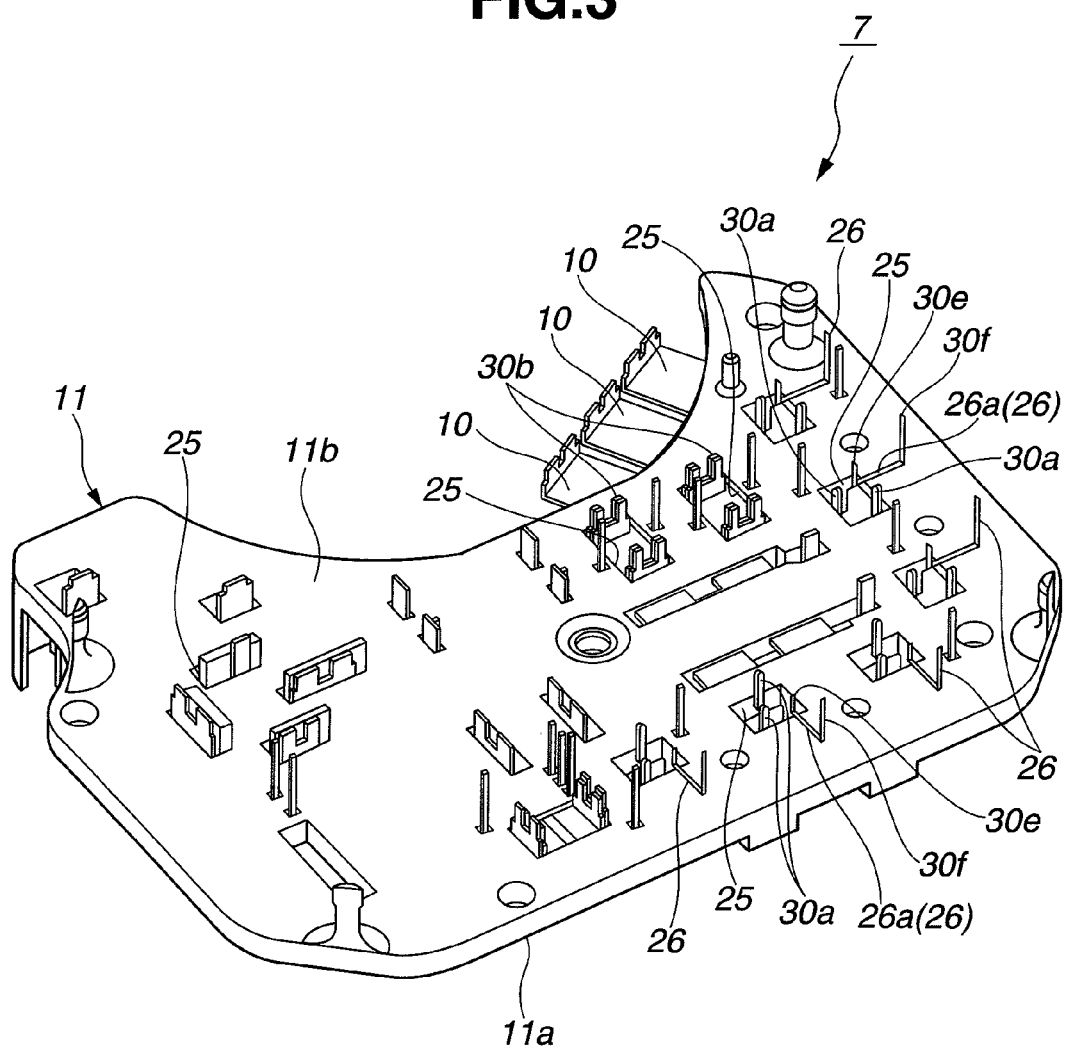
FIG. 3 is a perspective view of a first subassembly of the motor unit, as viewed from a second side (or opening's or upper side).
Figure 4:
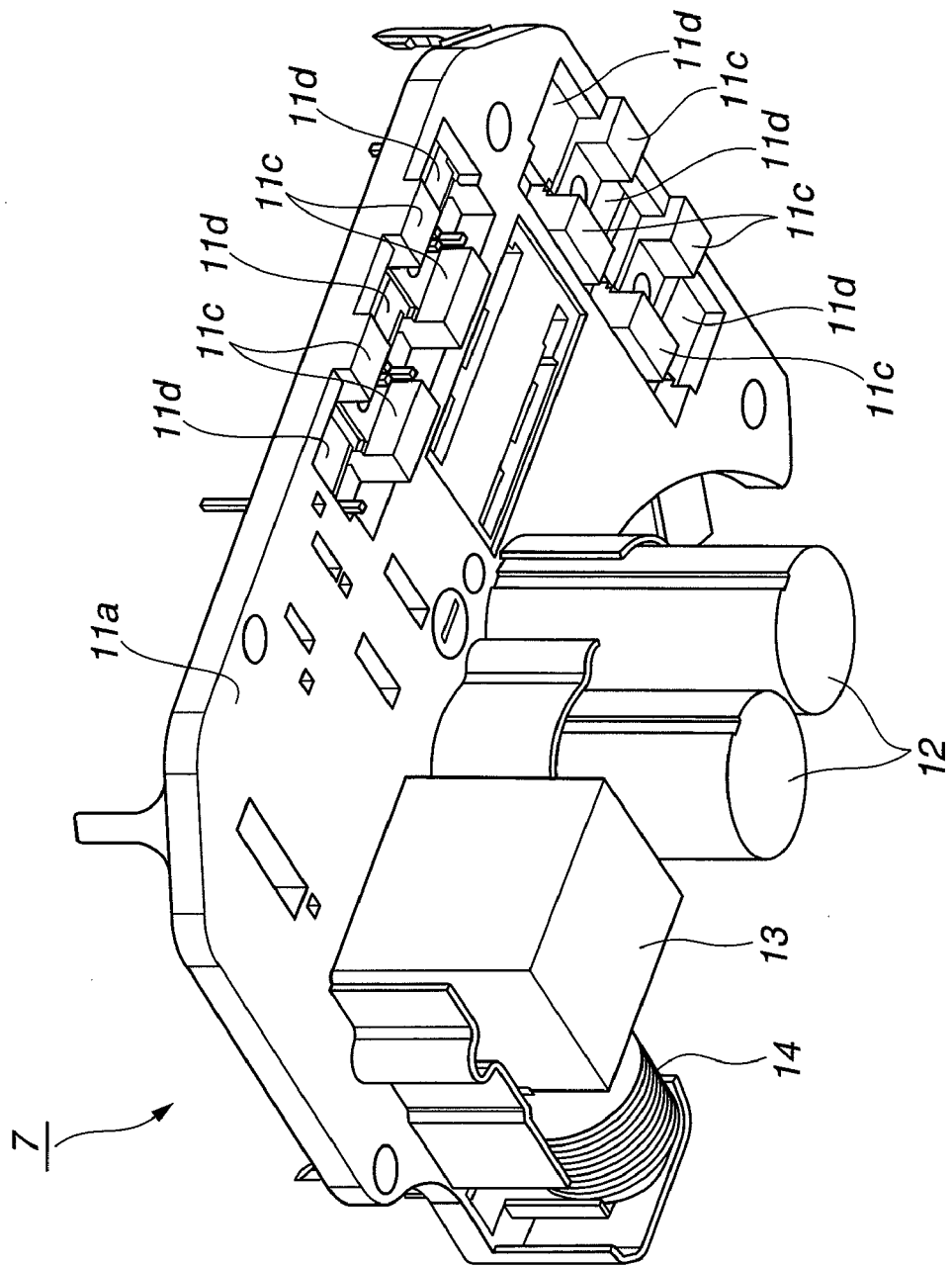
FIG. 4 is a perspective view of the first subassembly as viewed from a first side (or bottom's or lower side).
Figure 5:
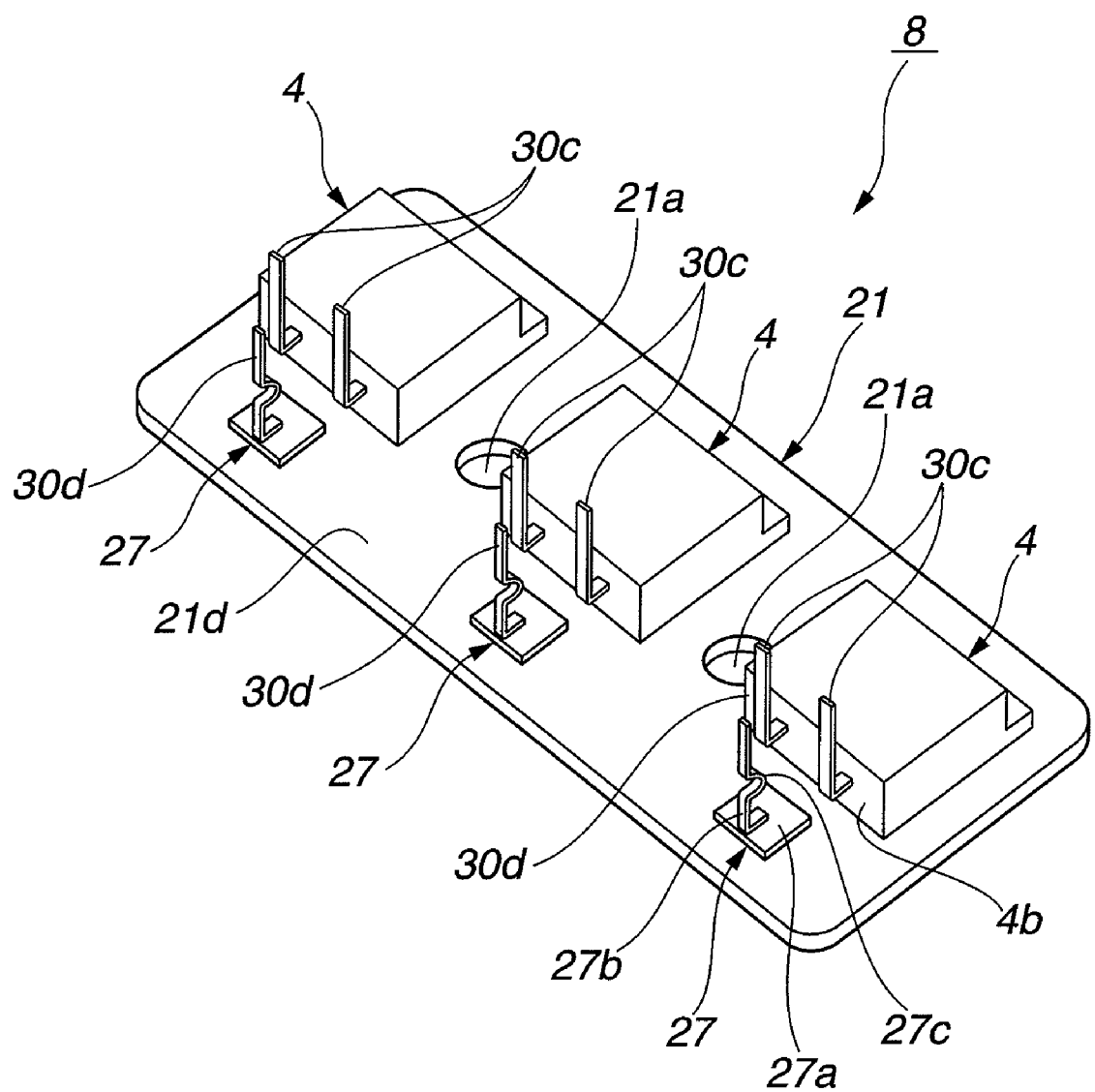
FIG. 5 is a perspective view of a second subassembly of the motor unit.
Figure 6:
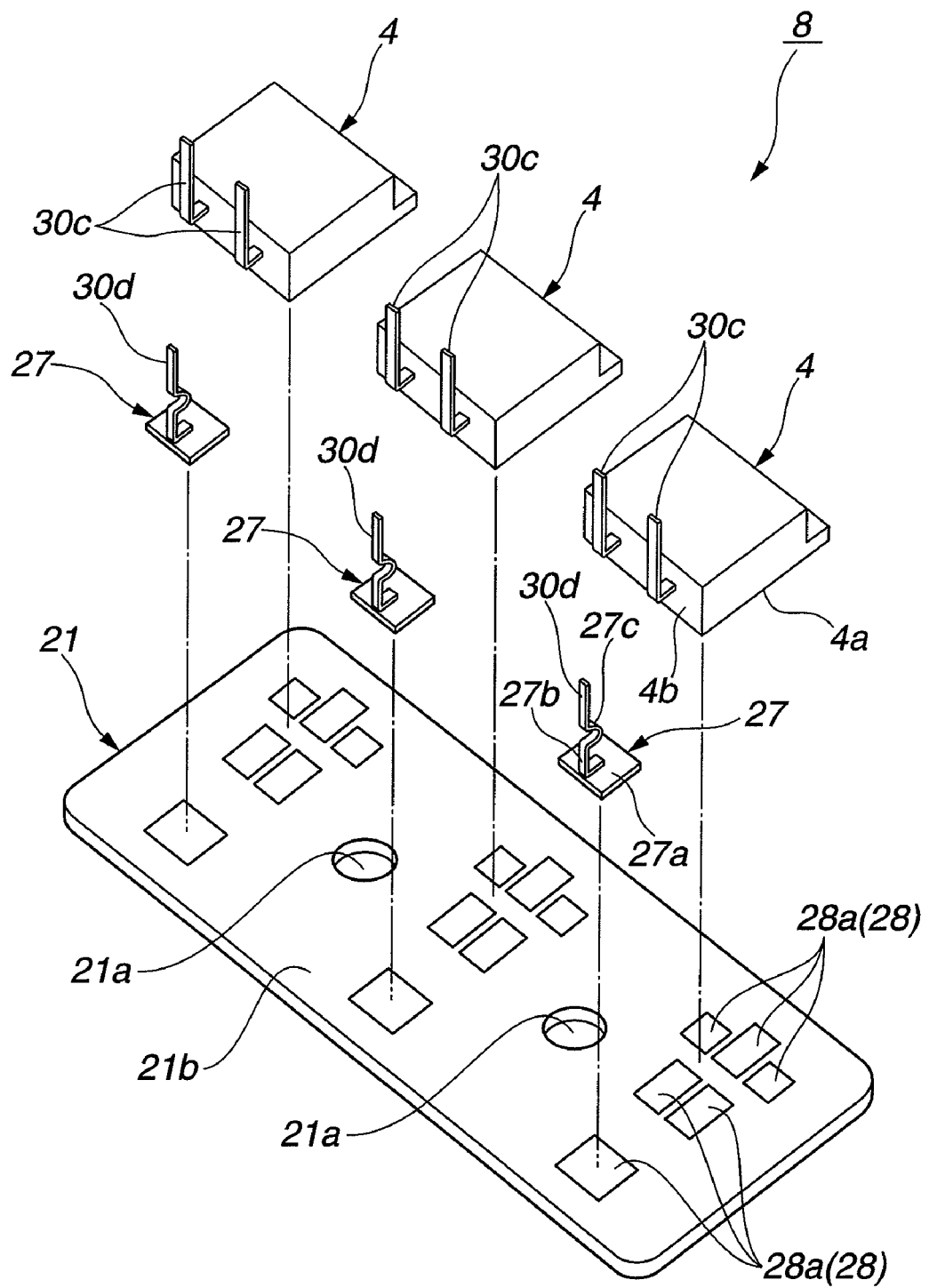
FIG. 6 is an exploded perspective view of the second subassembly.

FIGS. 2~6 show motor unit (or motor drive unit) 1 more in detail. FIG. 2 is an exploded perspective view showing part of motor unit 1. FIG. 3 is a perspective view of first subassembly 7 as viewed from a second (opening's or upper) side. FIG. 4 is a perspective view of first subassembly 7 as viewed from a first (bottom's or lower) side. FIG. 5 is a perspective view of one of second subassemblies 8 as viewed from the second side. FIG. 6 is an exploded perspective view of one of second subassemblies 8.

As shown in FIG. 2, motor (drive) unit 1 includes a housing 17 for enclosing the first, second and third subassemblies 7, 8 and 9. Housing 17 is made of thermally conductive material such as metallic material (aluminum alloy, for example) having a relatively good thermal conductivity. For example, housing 17 is a casting formed by metal casting (such as die casting). Housing 17 includes a partition wall 17*d* dividing the inside cavity of housing 17 into a cylindrical motor receiving portion 18 having an approximately cylindrical shape for containing the motor 2 (not shown in FIG. 2), and a parts receiving portion 19 having a tubular shape having a bottom. Partition wall 17*d* has a concave wall surface serving as the inside wall surface of motor receiving portion 18 and a convex wall surface as the inside wall surface of parts receiving portion 19. The motor receiving portion 18 extends along an imaginary center line along which an shaft (2*c* shown in FIG. 13) of motor 2 extends when motor 2 is installed. The parts receiving portion 19 extends in a second direction from the bottom to the opening (19*a*) of parts receiving portion 19, along the center line of motor receiving portion 18 whereas a first direction (extending from the opening 19*a* toward the bottom) is opposite to the second direction.

Figure 11:
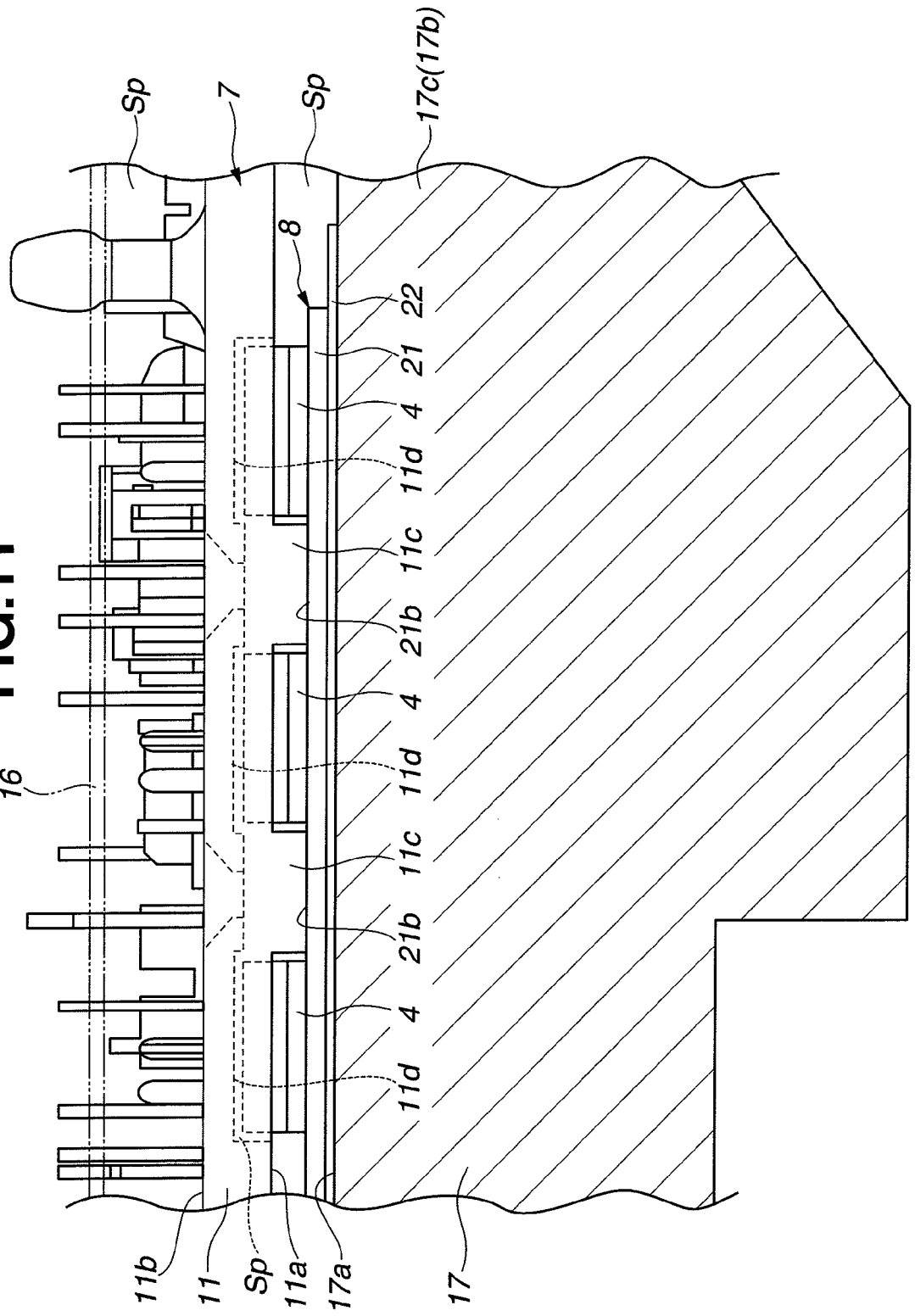
FIG. 11 is a sectional view taken across a line XI-XI shown in FIG. 9.
Figure 12:
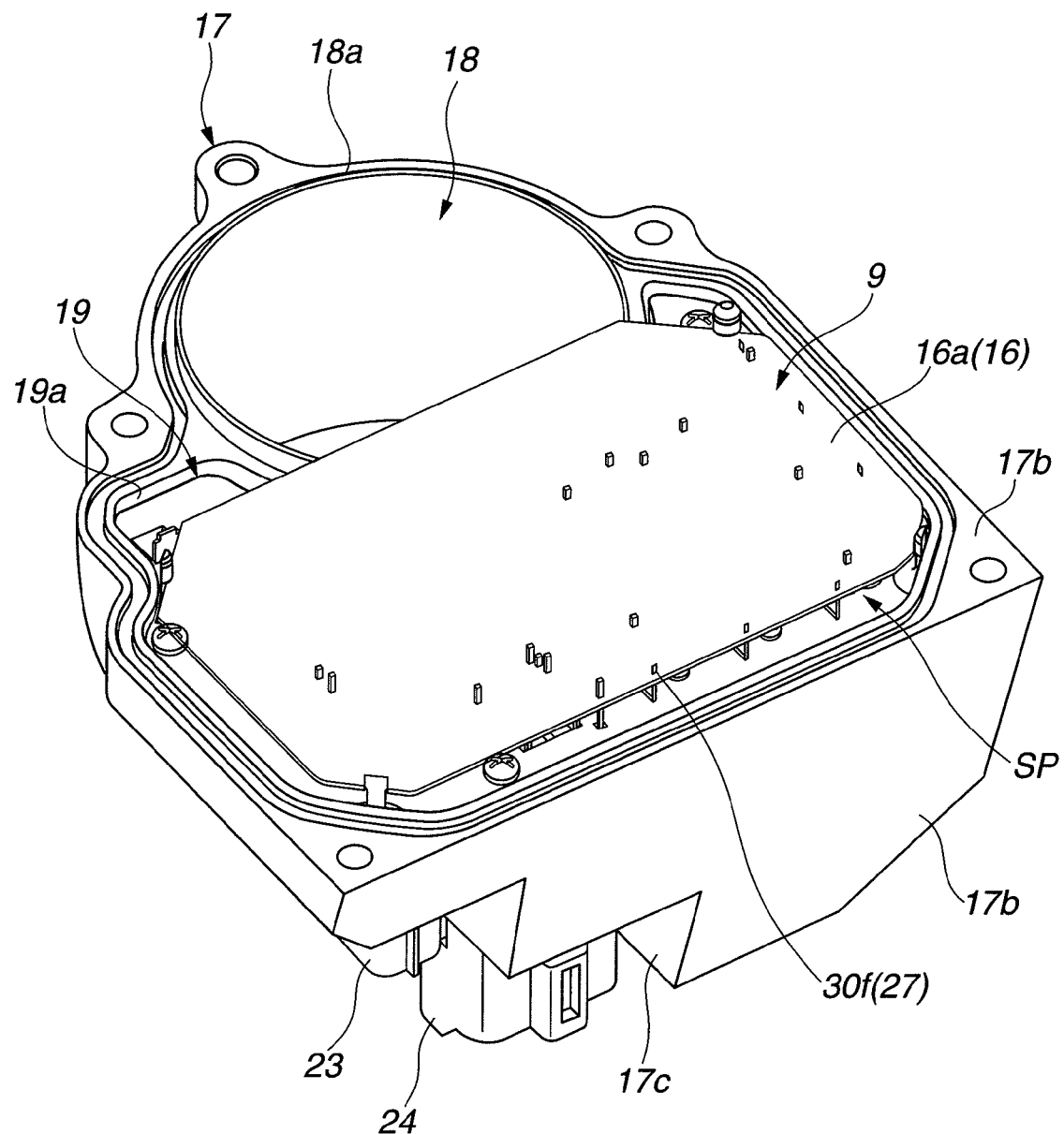
FIG. 12 is a perspective view showing the housing at the end of a step of installing a third subassembly above the first subassembly.

First, second and third subassemblies 7, 8 and 9 are installed in the parts receiving portion 19 and fixed to housing 17 by fastening devices 20 such as screws. In this embodiment, first, second and third subassemblies 7, 8 and 9 are stacked in the form of a three-tier stack structure composed of a first tier of second subassemblies 8 closest to the bottom of the parts receiving portion 19, a second tier of first subassembly 7 and a third tier of third subassembly 9. Therefore, first subassembly 7 is interposed, between the second assemblies 8 lying on a first (bottom's) side of first subassembly 7 and the third subassembly 9 lying on a second (opening's) side of first subassembly 7 near the opening (18*a*, 19*a*) of housing 17, along the imaginary center line of motor receiving portion 18 (or along the motor shaft (2*c*) in the assembled state). There is provided an interspace Sp between the first board 16 of first subassembly 6 and the second board 21 of each of second subassemblies 8, and there is provided a similar interspace Sp between the first board 11 of first subassembly 7 and the third board 16 of third subassembly 9 (as shown in FIGS. 11 and 12). These interspaces are formed by shifting the fixing positions of the boards or by interposing one or more spacers between the subassemblies or by forming projections in one or more of the boards so as to serve as a spacer.

Housing 17 includes a (side) wall 17*b* having an inside wall surface 17*a* which is in contact, directly or through a thermally conductive member, with at least one of second subassemblies 8, and which enables heat conduction between the wall 17*b* and at least one of second subassemblies 8. In this example, the wall 17*b* is a side wall and the inside wall surface 17*a* of side wall 17*b* is a mount surface facing in the second direction toward the opening of housing 17, opposite to the first direction toward the bottom of the parts receiving portion 19. The second board 21 of each of subassemblies 8 is mounted on the mount surface 17*a* through the thermally conductive member in the form of a relatively thin rectangular mat 22.

Connectors 23 and 24 are provided for electrical connection from the outside. Connectors 23 and 24 have terminal segments 30*g* projecting into parts receiving portion 19 of housing 17 in the attached state (shown in FIG. 8). Connector 23 is a signal connector for connection with external CPU, sensor and/or other devices through harness. Connector 24 is a supply connector for connection with dc power source 6 through harness.

As shown in FIGS. 3 and 4, the first board 11 of first subassembly 7 is in the form of a relatively thick flat plate including therein the bus bars 10. First board 11 can be formed by the process of insert molding including a step of placing the bus bars 10, respectively, at predetermined positions in a mold, a step of pouring, into the mold, a molten insulating synthetic resin (such as PBT (polybutylene terephthalate), PPS (polyphenylene sulfide) or PA (polyamide)), and a step of forming a single solid board with bus bars 10 encapsulated by the resin. In this case, part of each bus bar 10 (such as a portion forming a terminal segment) is bared to the outside of first board 11 for electrical connection with terminal portions of motor 2 and various other components by welding or soldering.

Figure 10:
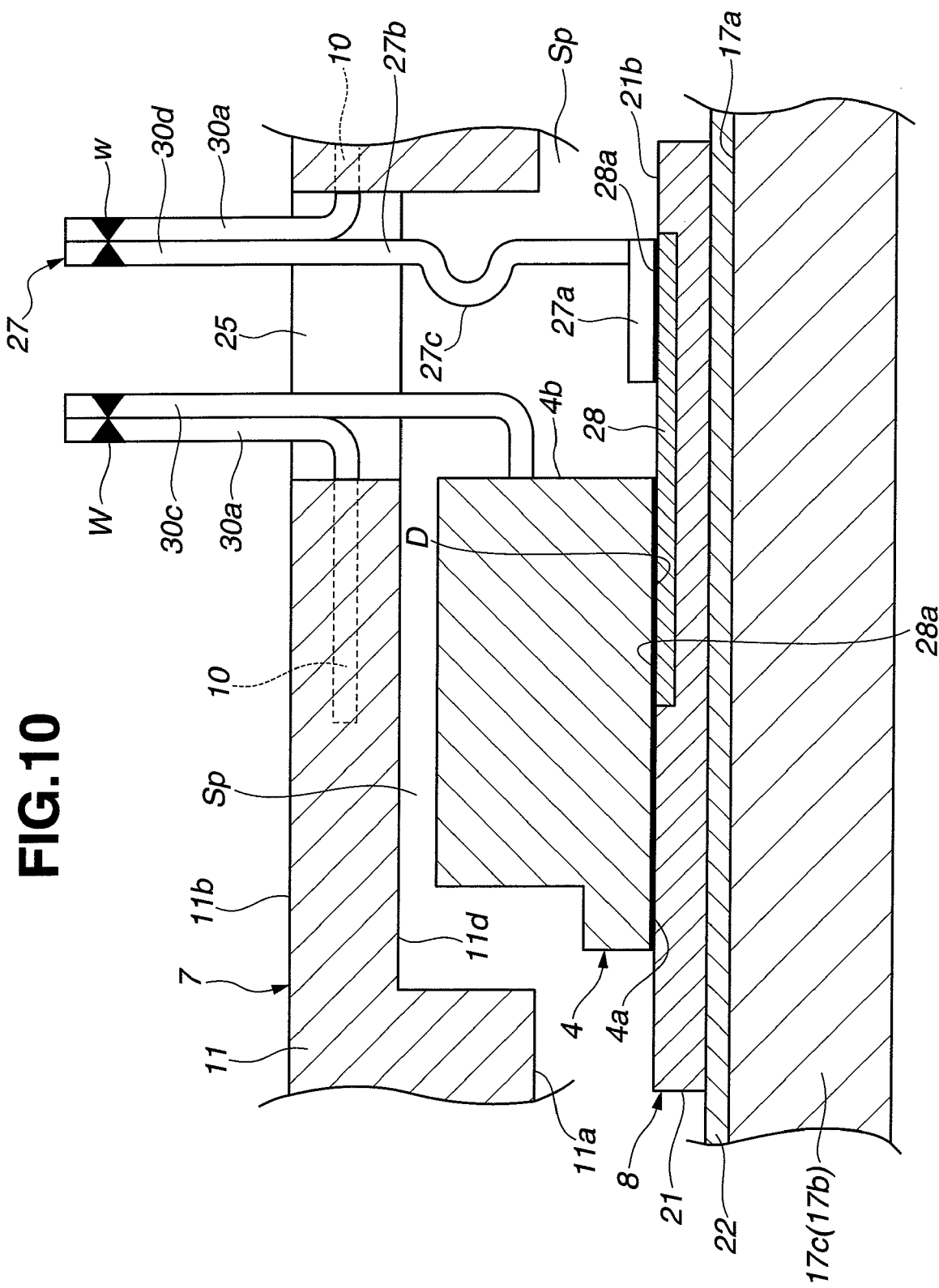
FIG. 10 is a sectional view taken across a line X-X shown in FIG. 9.

First board 11 is formed with a plurality of through holes 25 extending through first board 11 from a first surface 11*a* on the first (bottom's) side to a second surface 11*b* on the opposite second (opening's) side. Some of the through holes 25 are not plain through hole, but peculiar through holes each of which is defined and surrounded by a side wall from which the terminal segment 30*a* of at least one bus bar 10 projects into the through hole 25. In each of these peculiar through holes 25, the bared terminal segment 30 bends and then extends in the second direction toward the opening 19*a* of parts receiving portion 19. In this case, the bus bar 10 includes a buried portion buried in first board 11, a lateral portion extending from the buried portion into the through hole 25 along the second surface 11*b* of first board 11, a bent portion forming approximately a right angle, and a projecting portion extending in the second direction (approximately perpendicular to the second surface 11*b*) toward the opening 19*a* of parts receiving portion 19 beyond the second surface 11*b* (as best shown in FIG. 10). Moreover, terminal segments 30*b* of the components (such as capacitors 12, relay 13, coil 14 and current sensors 15) mounted on first board 11, terminal segments 30*g* of connectors 23 and 24, and terminal segments 30*c* and 30*d* extending from second subassemblies 8 are extended through some of the through holes 25 from the first (bottom's) side to the second (opening's) side of first board 11, so that the forward ends of terminal segments 30*a*~30*d* and 30*g* are located on the second (opening's) side of first board 11. To form the drive circuit 3 as shown in FIG. 1, terminal segments 30*b*~30*d* and 30*g* are joined with terminal segments 30*a* of bus bars 10 at respective joint portions located on the second (opening's) side of first board 11.

As shown in FIG. 3, one or more relay members 26 project from the second surface (backside surface) 11*b* of first board 11. Each of relay members 26 has a U-shaped portion including a fixed portion 26*a* extending along the second surface 11*b* from a first end to a second end, a first (shorter) terminal segment 30*e* projecting from the first end of fixed portion 26*a* at the brim of one of through holes 25 in the second direction approximately perpendicular to the flat second surface 11*b*, and a second (longer) terminal segment 30*f* projecting from the second end of fixed portion 26*a*, longer in the second direction toward the opening of housing 17. The first terminal segment 30*e* is joined with one of terminal segments 30*c* extending from one second subassembly 8 (shown in FIGS. 5 and 6) at a joint portion on the second side of first board 11. The second (longer) terminal segment 30*f* is joined with a conducting portion of third subassembly 9. In this way, each of relay members 26 is used to connect the second subassemblies 8 with third subassembly 9. Preferably, relay members 26 are fixed in first board 11 by the insert molding together with bus bars 10.

As shown in FIG. 4, main body portions of the circuit components (capacitors 12, relay 13 and coil 14) project from the first surface (front surface) 11*a* of first board 11 (in the first direction toward the bottom of part receiving portion 19 in the assembled state). These main body portions are received in a recessed portion in the part receiving portion 19, as shown in FIG. 2.

As shown in FIGS. 5 and 6, each of second subassemblies 8 includes the second board 21 in the form of an approximately rectangular, relatively thin flat plate (thinner than the first board 11 in this example), one or more switching devices 4 (three in number in this example), and one or more extension members 27 provided for switching devices 4 one to one.

In the example shown in FIGS. 5 and 6, three of the switching devices 4 are arranged in a row in a longitudinal direction of rectangular second board 21. Second board 21 is formed with two circular fastener holes 21*a* extending through at two positions each between two adjacent switching devices 4. Second assembly 4 is fixed to housing 17 by fastening devices 20 passing, respectively, through these fastener holes 21*a*, as shown in FIG. 2.

As shown in FIG. 6, conductive members 28 are buried in second board 21 and bared at least partly in a second surface 21*b* of second board 21. Switching devices 4 and extension members 27 are mounted on the second surface 21*b* and electrically connected with bared portions 28*a* of the conductive members 28 so as to form the circuit as shown in FIG. 1, by the technique of surface mounting using solder.

Each of extension members 27 includes a flat plate-like base portion 27*a* and a pin 27*b* projecting upright from base portion 27*a*. The pin 27*b* includes a curved portion 27*c* between a lower portion extending straight from base portion 27*a* to curved portion 27*c* and an upper portion 30*d* extending straight from curved portion 27*c* and serving as a terminal segment 30*d* extending through one through hole 25 of first board 11, Each of the switching devices 4 of this example includes a first electrode which is a drain electrode D bared (or having a heat radiation plate bared) in a lower surface 4*a* of the switching device 4 abutting on the second surface 21*b* of second board 21. This drain electrode is electrically connected with at least one of the bared portions 28*a* of conductive members 28 by welding, ultrasonic welding or other method. Thus, the drain electrode is connected with the extension member 27 by the conductive member 28 including a first bared portion 28*a* joined with drain electrode, a second bared portion 28*a* joined with the base portion 27*a* of the extension member 27, and a buried portion extending in second board 21, from the first bared portion to the second bared portion. Therefore, the terminal segment 30*d* is a terminal segment of the drain electrode D.

Each of terminal segments 30*c* of second and third electrodes (source electrode S and gate electrode G) of the switching device 4 includes a lateral portion projecting from an upright side surface 4*b* of the switching device 4 in a lateral direction along the surface 21*b* of second board 21, and an upright portion extending in the second direction substantially perpendicular to the surface 21*b*, toward first subassembly 7 so as to form a right angle with the lateral portion. In the installed state in which the switching device 4 is mounted on second board 21, the lateral portion extends along the surface 21*b* and the upright portion is substantially perpendicular to the surface 21*b*.

As shown in FIG. 5, the three terminal segments 30*d*, 30*c* and 30*c* of the first, second and third electrodes of each switching device 4 project straight in the same second direction substantially perpendicular to the surface 21*b* of second board 21, respectively, at three separate positions arranged to form an isosceles triangle or an equilateral triangle.

FIGS. 7~13 are views for illustrating the assembly process and the assembled structure of motor (drive) unit 1. FIGS. 7-9, 12 and 13 are perspective views for illustrating the assembly process. FIG. 10 is a sectional view taken across a line X-X shown in FIG. 9. FIG. 11 is a sectional view taken across a line XI-XI shown in FIG. 9.

Figure 7:
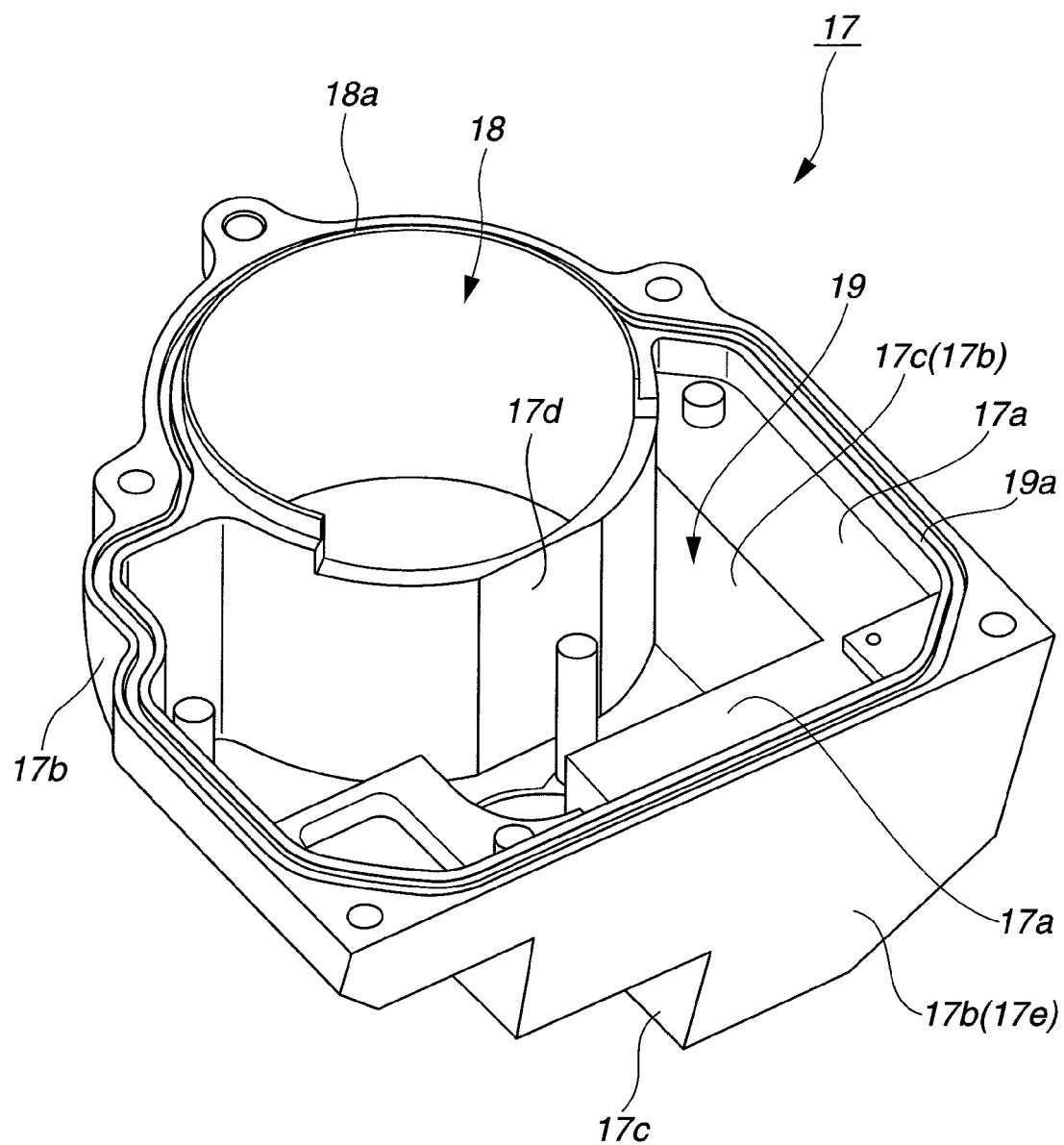
FIG. 7 is a perspective view showing a housing of the motor unit of FIG. 2.

As shown in FIG. 7, the side wall 17*a* defining the parts receiving portion 19 includes a thin wall portion and a thick wall portion 17*c* projecting inwards so as to form a step having the inside mount surface 17*a* in the form of a shoulder surface facing in the second direction toward the opening of housing 17, opposite to the first direction toward the bottom of parts receiving portion 19. The thin wall portion extends from the thick wall portion 17*c* in the second direction, and the thick wall portion 17*c* bulges inwards from the thin wall portion. In the example of FIG. 7, housing 17 includes two of the inside mount shoulder surfaces 17*a* (formed respectively in two of the thick wall portions 17*c*) for supporting two of the second subassemblies 8. These mount shoulder surfaces 17*a* are rectangular flat surfaces connected so as to form an L-shaped surface (formed by an L-shaped thick wall portion).

Preferably, the mount surfaces 17*a* are formed at positions separate from the partition wall 15 dividing the inside of housing 17 into motor receiving portion 18 and parts receiving portion 19. In this example, the side wall 17*b* includes a confronting wall 17*e* confronting the partition wall 17*d* across parts receiving portion 19, and one of the mount surfaces 17*a* is formed in this confronting wall 17*e*. The motor receiving portion 18 and parts receiving portion 19 are open in the second direction (upwards as viewed in FIG. 7), and the mount surfaces 17*a* face in the second (upper) direction toward the opening 19*a* of parts receiving portion 19.

Figure 8:
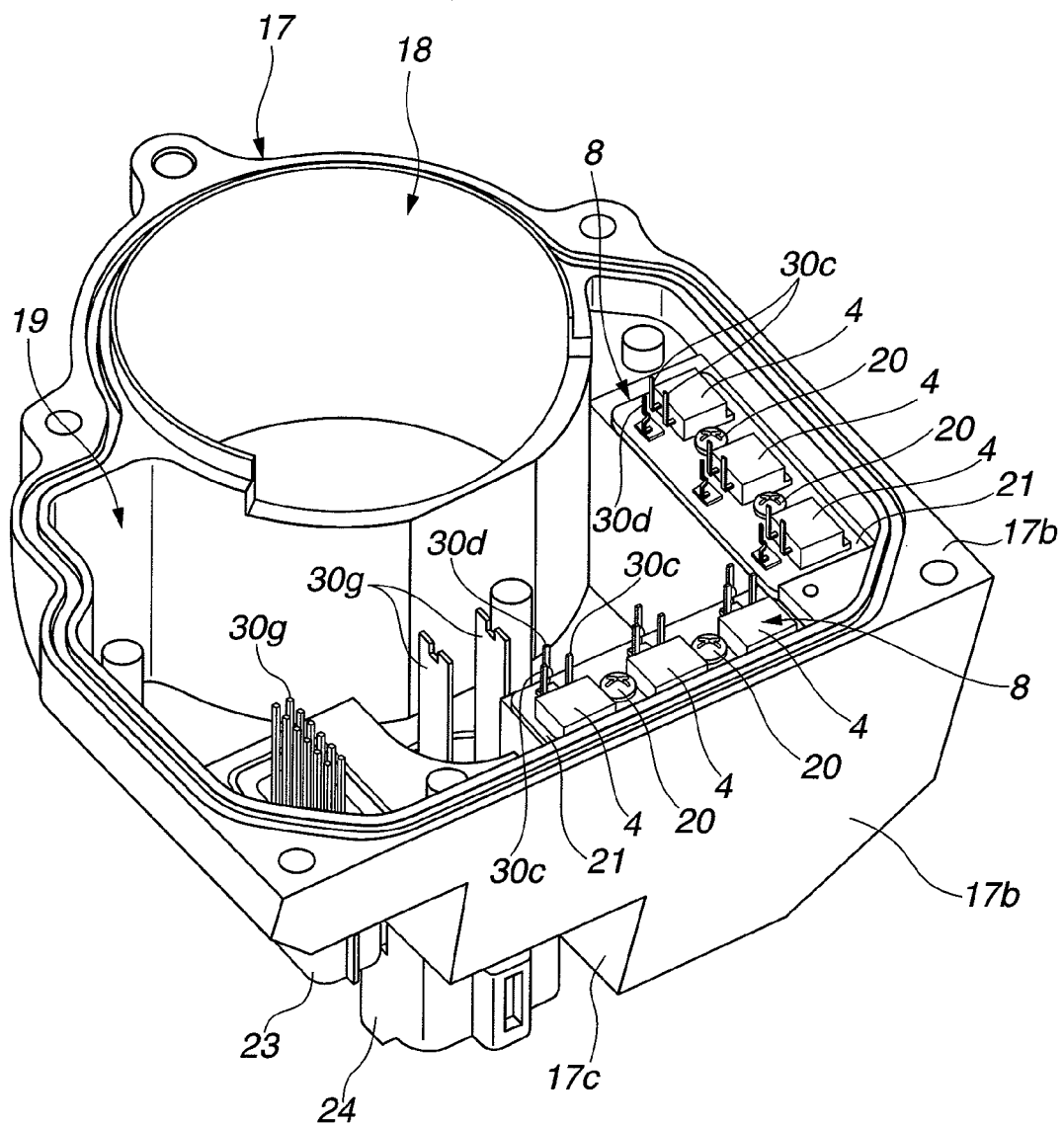
FIG. 8 is a perspective view showing the housing at the end of a step of attaching two of the second subassemblies and connectors to the housing.

As shown in FIG. 8, second subassemblies 8 are placed on the mount surfaces 17*a* through the mats 22 (shown in FIG.

2), respectively, and fixed to housing 17 by screw fasteners 20. Moreover, the connectors 23 and 24 are plugged into respective connector holes (not shown) formed in the bottom of parts receiving portion 19. In the state of FIG. 8, the (straight) terminal segments 30c and 30d of second subassemblies 8 and the (straight) terminal segments 30g of connectors 23 and 24 all stand upright in parts receiving portion 19, and project straight in the same second direction toward the opening 19a of parts receiving portion 19.

The second board 21 of each second subassembly 8 has an elongated shape and the switching devices 4 are arranged in a line along the longitudinal direction of second board 21. This arrangement makes it easier to dispose the switching devices 4 along the side wall 17b. Switching devices 4 in each second assembly 8 project from the second surface 21b of second board 21, and the flat first surface of second board 21 is entirely in contact with the mount surface 17a through the thermally conductive mat 22 for optimal thermal conduction between the second board 21 and housing 17.

Figure 9:
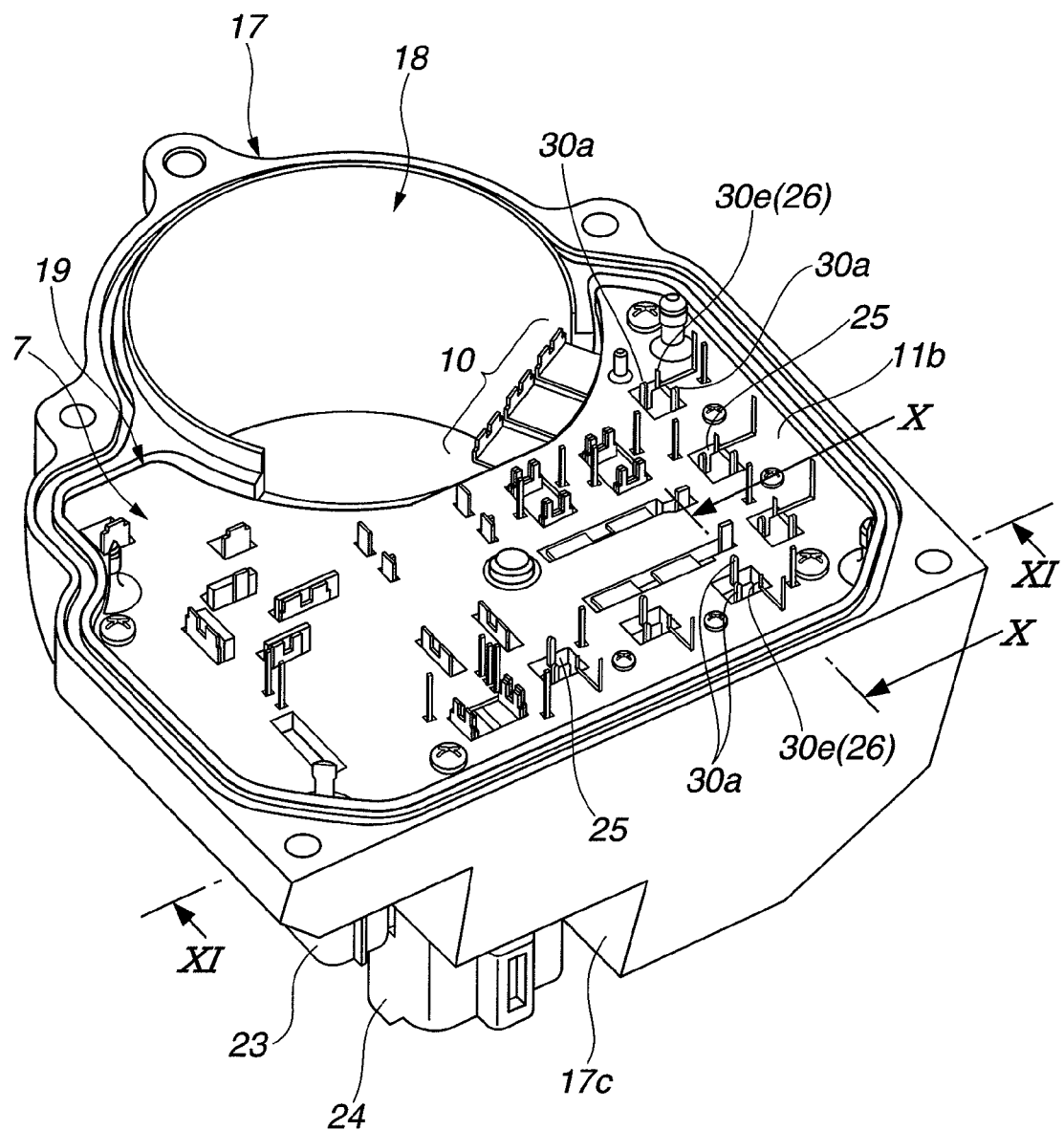
FIG. 9 is a perspective view showing the housing at the end of a step of installing the first subassembly above the second subassemblies.

Then, as shown in FIG. 9, first subassembly 7 is installed from the opening 19a of parts receiving portion 19, in the posture having the first surface 11a of first board 11 (shown in FIG. 4) facing in the first direction toward the bottom of parts receiving portion 19, and the second surface 11b facing in the second direction toward the opening 19a of parts receiving portion 19. Therefore, the main body portions of the circuit components (such as capacitors 12, relay 13 and coil 14) project from first board 11 in the first direction toward the bottom while the terminal segments 30a, 30e and 30f project from first board 11 in the first direction toward the opening 19a of parts receiving portion 19.

When first subassembly 7 is set at the predetermined correct position in parts receiving portion 19, the straight upright terminal segments 30c, 30d etc. of second subassemblies 8 pass through the corresponding through holes 25 of first subassembly 7, and extend side by side closely or contiguously with the mating terminal segments 30a, 30e etc. (shown in FIG. 3), as best shown in FIG. 10. The thus-paired mating terminal segments of the first and second assemblies 7 and 8 are joined together so as to form respective joint portions on the second side of first subassembly 7.

In this example, the terminal segments 30a and 30e of first subassembly 7 are joined with the terminal segments 30c and 30d of second subassemblies 8 by welding (such as TIG welding). As shown in FIG. 10 and FIG. 3, these terminal segments 30a, 30c, 30d and 30e project from the second surface 11b of first board 11 in the direction substantially perpendicular to the second surface 11b, and hence enable the welding at a level W away from the second surface 11b of first board 11 on the second (opening's) side. Therefore, the first board 11 serves as the barrier wall for restraining undesired influence of heat of the welding onto the circuit components mounted in first and second subassemblies 7 and 8.

The connection between the terminal segments 30a of first subassembly 7 and the terminal segments 30b of circuit components (such as capacitors 12, relay 13 and coil 14) of first subassembly 7 can be performed preliminarily before the operation of installing first subassembly 7 in housing 17. Moreover, it is optional to employ a method of attaching the circuit components provisionally to first board 11 with a mechanism for fitting or engaging, and then joining the terminal segments 30a of first subassembly 7 and the terminal segments 30b of the circuit components of first subassembly 7 at the time of operation of joining the terminal segments 30a and 30e of first subassembly 7 and the terminal segments 30c and 30d of second subassemblies 8. In this case, it is preferable to employ the same joining method (such as TIG welding) for joining these terminal segments.

The curved portion 27b of pin 27b of each extension member 27 can function to absorb small deviations of the fixing positions of first and second subassemblies 7 and 8, and to decrease the force applied to the joint portion.

As shown in FIG. 11, first subassembly 7 is arranged to press the second subassemblies 8 onto the respective mount surfaces 17a of housing 17. First board 11 is formed with projections 11c projecting from the first surface 11a facing toward the bottom of parts receiving portion 19, as shown in FIG. 4. When first assembly 7 is fixed to housing 17 by screw fasteners 20 shown in FIG. 2, these projections 11c of first board 11 push the second boards 8 in the first direction toward the bottom by abutting on the second surfaces 21b of second boards 21, and thereby press each second board 8 uniformly to the mount surface 17a of housing 17. The thermally conductive mat 22 provided between each second board 21 and mount surface 17a as shown in FIG. 2 and FIG. 10 is an elastic member having an elasticity (compressibility and flexibility), so that the mat 22 can absorb fabrication errors in the stacking direction of first and second boards 11 and 21.

One or more recessed portions 11d are formed in the first surface 11a of first board 11 to prevent abutment of first board 11 on each switching device 4. If first board 11 abuts on the second surfaces of switching devices 4 and pushes the switching devices 4 in the first direction, the contact between second subassemblies 8 and housing 17 may be deteriorated by the nonuniformity in the height of switching devices 4, and the switching devices 4 may be damaged by receiving external shock. Therefore, one recessed portion 11d is provided for each of switching devices 4, and each switching device 4 is disposed in one of the recessed portions 11d so as to form a clearance Sp between the switching device 4 and first board 11. Thus, first board 11 is so shaped as to prevent direct contact with the switching devices 4, even if their heights are irregular, with the recessed portions 11d, and to press second boards 21 of second assemblies 8 to the mount surfaces 17a of housing 17 with the projections 11c to improve the thermal contact therebetween to improve the performance of heat dissipation.

Then, as shown in FIG. 12, third subassembly 9 is installed above first subassembly 7. First subassembly 7 is disposed between the third subassembly 9 located on the second (opening's) side of first subassembly 7, and the second subassemblies 8 located on the first (bottom's) side of first subassembly 7. There is provided an interspace Sp between first board 11 and third board 16 (as shown in FIG. 11). Part of the terminal segments 30a and 30f of first subassembly 7 extend through one or more through holes (not shown) opened in third board 16, and project in the second direction from a second surface 16a of third board 16 on the second (opening's) side of third board 16. These portions of the terminal segments 30a and 30f projecting from second surface 16a of third board 16 are joined with conductive portions (such as a printed pattern of conductive material, or pins, not shown) of third subassembly 9, together (by soldering, for example) on the second side of third board 16. Electronic components of third subassembly 9 are mounted on the first surface or the second surface 16a of third board 16.

Figure 13:
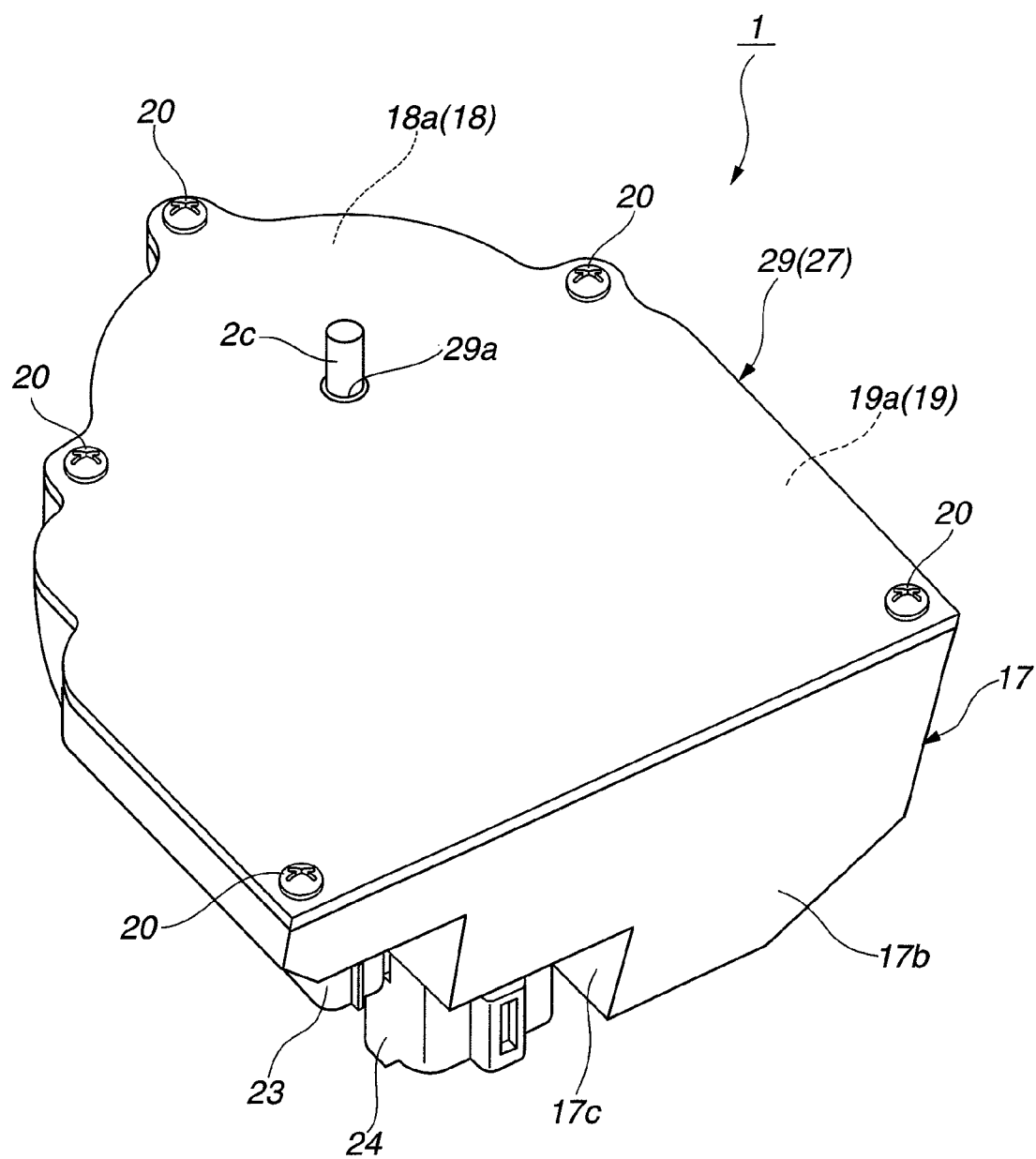
FIG. 13 is a perspective view showing the housing at the end of a step of closing the opening of the housing with a cover member covering the third subassembly.

Then, as shown in FIG. 13, a cover member 29 is fixed to housing 17 by screw fasteners 20 so as to close the opening 18a of motor receiving portion 18 and the opening 19a of parts receiving portion 19. Cover member 29 is formed with a shaft hole 29 through which the motor shaft 2c of motor 2 installed in motor receiving portion 18 projects outwards.

Thus, the assembly process according to the illustrated embodiment includes a first step of installing at least one second subassembly 8 in housing 17 as shown in FIG. 8, and a second step of installing the first subassembly 7 in housing 17 as shown in FIG. 9 (and electrically connecting the first and second subassemblies on the second side of the first subassembly). The assembly process may further include a third step of installing the third subassembly 9 in housing 17 as shown in FIG. 12, after the second step. The assembly process may further include a preparing step of preparing the housing 17 as shown in FIG. 7 before the first step, and a fourth step of closing the opening of housing 17 as shown in FIG. 13, after the third step.

According to the illustrated embodiment of the present invention, a motor drive apparatus comprises a first subassembly (7) including a first board (11) and a connecting section including at least one connecting member (such as a bus bar 10) formed in the first board, and a second subassembly (8) including a second board (21) and a switching section including at least one switching device (4) mounted on the second board, and the first and second subassemblies (7, 8) are stacked with an interspace (Sp) between the first and second boards, and connected by connecting at least one terminal segment (30a) of the connecting section (10) with at least one terminal segment (30c or 30d) of the switching section (4). This structure makes it possible to install a plurality of components (such as the switching devices (4)) together in the form of the second subassembly (8), and thereby facilitates the assembly process. With the interspace (Sp), this structure can restrain undesired influence on the first board (11) from the heat produced by the switching device.

According to the illustrated embodiment, the switching section of the second subassembly (8) includes a set of switching devices (4) and the connecting section of the first subassembly (7) includes a set of connecting members (such as bus bars 10). The connection section may further include one or more (non-switch) circuit components (12, 13, 14). The switching section and the connecting section are electrically connected to form the drive circuit (3). Thus, the drive circuit (3) is divided into the switching section of the switching devices and the connecting section including the remaining circuit component or components other than the switching devices.

According to the illustrated embodiment, the first board (11) is formed with at least one through hole (25), the terminal segment (30c, 30d) of the switching section (4) is extended through the through hole (25) and connected with the terminal segment (30a) of the connecting member in the form of a bus bar (10), at a joint portion (W) on the second (opening's) side of the first subassembly (7) so that the first subassembly (7) is located between the joint portion on the second side and the second subassembly (8) on the first side opposite to the second side. This structure can prevent influence of the heat produced by an operation of joining the terminal segments from being transmitted to the switching device on the opposite side.

According to the illustrated embodiment, the joint portion between the terminal segment (30c, 30d) of the switching device (4) and the terminal segment (30a) of the bus bar (10) is formed (by welding) at a position separate from the second surface (11b) of the first board (11). This structure can protect the first board (11) and the switching device (4) from undesired influence caused by the joining operation (such as welding).

According to the illustrated embodiment, the motor drive apparatus further comprises a third subassembly (9) including a third board (16) and a control circuit (5) formed on and/or in the third board, the third assembly (9) is stacked or superposed on the first assembly (7) with an interspace (Sp) between the first board (11) and the third board (16), and the first subassembly (7) is interposed between the switching device (4) of the second subassembly (8) and the control circuit (5) of the third subassembly (9). Therefore, the intervening first subassembly (7) can serve as a barrier for preventing the heat produced by the switching device (4) from affecting the control circuit (5) of the third subassembly (9). When the electronic components of the control circuit are formed on the second surface of the third board (16) away from the first board, then the third board (16), too, can serve as a barrier for protecting the control circuit from the heat of the switching device.

According to the illustrate embodiment, the motor drive apparatus further comprises a (thermally conductive) housing (17) of a thermally conductive material, and the second subassembly (8) is disposed in the housing so as to abut on an inside (mount) surface (17a) of the housing, directly or through a heat conductive member (22). This structure can enable the transfer of heat produced by the switching device (4) of the second subassembly (8) to the housing (17) directly or through the heat conductive member (22), and promote the dissipation of heat effectively through the housing (17).

According to the illustrated embodiment, the second board (21) is pressed against the inside (mount) surface (17a) of the housing (17) by the first board (11) (with supporting portion or projection (11c) and screw fastener (20)). This structure increases the contact area and the tightness of the second board (21) onto the housing (17) and thereby improve the cooling or heat dissipating performance. Moreover, the structure pressing the second subassembly makes it possible to eliminate the fastening devices (20) for fastening the second board (21) to the housing (17), and instead to provide a mechanism for positioning the second board (21) with respect to the housing (17). In this case, it is possible to reduce the number of the required component parts, and thereby to reduce the weight and the manufacturing cost.

According to the illustrated embodiment, the housing (17) includes a side wall (17b, 17e) which defines a parts receiving portion (19) receiving the first and second subassemblies (7, 8), and which is formed with a step including a shoulder surface (17a) on which the second subassembly (8) is mounted. Therefore, the side wall (17b, 17e) of the parts receiving portion (19) can be used effectively as means for heat transfer, means for heat dissipation, or a heat sink.

According to the illustrated embodiment, the side wall (17b) includes a thick wall portion (17c) including the shoulder surface (17a) serving as the mount surface supporting the second subassembly (8). This structure can improve the heat dissipating performance of the second subassembly (8) by utilizing the heat capacity of the thick wall portion (17c). It is optional to provide one or more fins projecting from the outside surface of the thick wall portion (17c), outwards to improve the heat dissipating performance by increasing the outside surface area of the housing (17).

According to the illustrated embodiment, the housing (17) includes a partition wall (17d) separating a parts receiving portion (19) receiving the first and second subassemblies (7, 8) and a motor receiving portion (18) receiving the motor (2), from each other, and a side wall (17e, 17b) which defines the parts receiving portion and which is separate from the motor receiving portion (18) and from the partition wall (17d), and the second subassembly (8) is supported on the mount surface formed in the side wall (17e, 17b). This structure prevent the heat produced by the motor (2) from adversely affecting the heat dissipating performance of the switching device (4).

According to the illustrated embodiment, the second subassembly (8) include a plurality of the switching devices (4) arranged in a row in the longitudinal direction in which the second board (21) is elongated. Therefore, the switching devices (4) can be readily arranged along the side wall (17b, 17e) so that the heat of each switching device (4) can be transmitted efficiently to the housing (17).

According to the illustrated embodiment, the motor drive apparatus comprises a plurality of the second subassemblies having the same construction. The use of the identical subassemblies reduces the cost of the required parts, and the manufacturing cost.

According to the illustrated embodiment, the motor drive apparatus comprises a positive-side second subassembly (8) and a negative-side second assembly (8) which are connected with the motor that is a three phase alternating-current motor. The positive-side second subassembly (8) includes three of the switching devices (4) connected between the neutral point (2b) of the motor (2) and a positive supply terminal adapted to be connected with the positive electrode of the dc power source (6). The negative-side second subassembly (8) includes three of the switching devices (4) connected between the neutral point (2b) of the motor (2) and a negative supply terminal adapted to be connected with the negative electrode of the dc power source (6). By using the two identical second subassemblies (8), it is possible to install the switching devices compactly along the side wall (17b) of the housing (17), to reduce the cost of the required parts, to facilitate the assembly process and to reduce the manufacturing cost.

According to the illustrated embodiment, the or each second subassembly (8) includes first, second and third terminal (or lead) segments (30d, 30c) which are connected, respectively, with first, second and third electrodes (D, S, G) of the switching device (4) (FET), and these terminal segments (30d, 30c) all stand upright from the second board (21) toward the first board. Moreover, the first terminal segment (30d) is connected with the first electrode (D) of the switching device by a conductive member (28) formed in the second board (21). This structure makes it easier to increase the distances among these terminal segments (30d, 30c), and thereby to prevent the heat of a joining operation of each terminal segment with a mating terminal segment, from affecting the other terminal segments.

According to the illustrated embodiment, an extension member (27) includes a base portion (27a) joined with the conductive member (28) and an upright pin portion (27b) which projects upright from the base portion and which include the first terminal segment (30d) and a curved portion (30c). The curved portion makes the pin portion flexible and absorbs shifts or deviations of the mating terminal segments. Moreover, the curved portion can restrain a force produced in the base portion from being increased by a deviation of the terminal segment.

According to the illustrated embodiment, the terminal segments (30c, 30d) of the second subassembly (8) and the terminal segments (30a) of the bus bars (10) are joined together by welding. Therefore, the structure can reduce the electrical resistance of the joint portion, thereby reduce the energy loss and improve the durability.

According to the illustrated embodiment, the switching device includes a field effect transistor. Therefore, it is possible to reduce the required driving power, increase the switching speed, and facilitate the mounting operation. Moreover, the drain electrode D is connected with a conductive member (28) of the second board (21). Therefore, it is easier to employ a FET of a type having a heat radiation plate or heat dissipation plate on the drain electrode, and to mount the FET on the second board.

The present invention is not limited to the illustrated embodiment, and various modifications are possible. The motor may be of a type other than the three-phase inverter motor. The invention is applicable to various systems (various vehicle control units such as a brake control unit) other than the power steering system.

According to another aspect of the present invention, a control apparatus (or switching apparatus or assembly) comprises first and second subassemblies stacked one above the other. The first subassembly (7) includes a first board (11) and a plurality of connecting members (such as bus bars 10) each of which is formed in the first board, and arranged to conduct an electric current when one of switching devices (4) is turned on, and each of which includes a terminal segment (30a). The second subassembly includes a second board (21) located on a first (bottom's) side of the first board and a plurality of the switching devices each of which is mounted on the second board, and each of which includes a terminal segment (30c, 30d) connected with the terminal segment (30a) of one of the connecting members. Preferably, the terminal segments are joined together at a joint portion (W) located on a second (opening's) side of the first board opposite to the first side.

According to another aspect of the present invention, an assembly comprising: a first subassembly including a first board and a plurality of connecting members each of which is formed in the first board, and arranged to conduct an electric current when one of switching devices is turned on, and each of which includes a terminal segment; and a second subassembly including a second board located on a first side of the first board and a plurality of the switching devices each of which is mounted on the second board, and each of which includes a terminal segment connected with the terminal segment of one of the connecting members at a joint portion located on a second side of the first board opposite to the first side. In this assembly, the terminal segments of the second subassembly may extend through the first board of the first subassembly from the first side to the second side.

This application is based on a prior Japanese Patent Application No. 2008-072142 filed on Mar. 19, 2008. The entire contents of this Japanese Patent Application are hereby incorporated by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. A motor drive apparatus for a motor driven by a drive circuit, comprising:
   a first subassembly including a first board and a connecting section formed in the first board, and arranged to form a current supply path from a power source to the motor; and
   a second subassembly including a second board and a switching section mounted on the second board, the first and second subassemblies being stacked with an interspace between the first and second boards, a terminal segment of the switching section being connected with a terminal segment of the connecting section.

2. The motor drive apparatus as claimed in claim 1, wherein the connecting section includes a bus bar formed in the first board, the first board is formed with a through hole, the terminal segment of the switching section is extended through the through hole of the first board and connected with the terminal segment of the connecting section, the second board is located on a first side of the first board, and the terminal segment of the switching section and the terminal segment of the connecting section are connected with each other on a second side of the first board opposite to the first side.

3. The motor drive apparatus as claimed in claim 1, wherein the first subassembly includes the first board and the connecting section which includes a set of connecting members formed in the first board and arranged to form the drive circuit with the switching section of the second subassembly, and the second subassembly includes the second board and the switching section which includes a set of switching devices mounted on the second board, each of the switching devices being electrically connected with one of the connecting members at a joint portion so located that the first board is located between the joint portion and the second board.

4. The motor drive apparatus as claimed in claim 2, wherein the motor drive apparatus further comprises a third subassembly including a third board forming a control circuit to control the drive circuit, the third assembly is stacked on the first assembly with an interspace between the first board and the third board, and the first board is located between the second board on the first side and the third board on the second side.

5. The motor drive apparatus as claimed in claim 2, wherein the motor drive apparatus further comprises a housing enclosing the first and second assemblies, and including an inside surface on which the second subassembly abuts in a manner to conduct heat between the second subassembly and the housing.

6. The motor drive apparatus as claimed in claim 5, wherein the second subassembly is pressed against the inside surface of the housing by the first subassembly.

7. The motor drive apparatus as claimed in claim 5, wherein the housing includes a side wall which defines a parts receiving portion receiving the first and second subassemblies, and which is formed with a step including a shoulder surface, and the second subassembly is mounted on the shoulder surface.

8. The motor drive apparatus as claimed in claim 7, wherein the side wall of the housing includes a thick wall portion including the shoulder surface.

9. The motor drive apparatus as claimed in claim 5, wherein the housing includes a partition wall separating a parts receiving portion receiving the first and second subassemblies and a motor receiving portion receiving the motor, from each other, and a side wall which defines the parts receiving portion and which is separate from the motor receiving portion, and the second subassembly is supported on the side wall.

10. The motor drive apparatus as claimed in claim 5, wherein the second subassembly includes the switching section which includes a plurality of switching devices arranged in a row.

11. The motor drive apparatus as claimed in claim 10, wherein the second board of the second subassembly has a shape elongated along a longitudinal direction, and the switching devices are arranged along the longitudinal direction of the second board.

12. The motor drive apparatus as claimed in claim 1, wherein the motor drive apparatus comprises a plurality of the second subassemblies each including the second board and the switching section.

13. The motor drive apparatus as claimed in claim 12, wherein the motor drive apparatus comprises two of the second subassemblies which are a positive-side second subassembly and a negative-side second assembly, and which are connected with the motor that is a three-phase alternating-current motor, the positive-side second subassembly includes three switching devices connected between a neutral point of the motor and a positive supply terminal adapted to be connected with a positive electrode of the power source, and the negative-side second subassembly includes three switching devices connected between the neutral point of the motor and a negative supply terminal adapted to be connected with a negative electrode of the power source.

14. The motor drive apparatus as claimed in claim 1, wherein the second subassembly includes first, second and third terminal segments which are connected, respectively, with first, second and third electrodes of a switching device included in the switching section, and which all stand upright from the second board toward the first board.

15. The motor drive apparatus as claimed in claim 14, wherein the first terminal segment is a portion of an extension member which is connected with the first electrode of the switching device by a conductive member formed in the second board.

16. The motor drive apparatus as claimed in claim 15, wherein the extension member includes a base portion joined with the conductive member and an upright portion which projects upright from the base portion and which includes the first terminal segment and a curved portion.

17. The motor drive apparatus as claimed in claim 14, wherein the switching device includes a field effect transistor, and the first terminal segment is connected with the first electrode of the switching device which is a drain electrode.

18. The motor drive apparatus as claimed in claim 14, wherein the connecting section of the first assembly includes three connecting members each including a terminal segment which projects from the first board to a second side and which is connected with one of the first, second and third terminal segments of the second subassembly on the second side of the first board.

19. The motor drive apparatus as claimed in claim 1, wherein the motor drive apparatus further comprises the motor.

20. The motor drive apparatus as claimed in claim 1, wherein the motor drive apparatus is a power steering motor drive apparatus adapted to produce a power steering assist torque with the motor.

* * * * *